United States Patent [19]

Bonham

[11] 3,905,815

[45] Sept. 16, 1975

[54] PHOTOPOLYMERIZABLE SHEET MATERIAL WITH DIAZO RESIN LAYER

[75] Inventor: James A. Bonham, Pine Springs, Minn.

[73] Assignee: Minnesota Mining and Manufacturing Company, St. Paul, Minn.

[22] Filed: Dec. 5, 1973

[21] Appl. No.: 422,083

Related U.S. Application Data

[63] Continuation of Ser. No. 209,137, Dec. 17, 1971, abandoned.

[52] U.S. Cl. .......... 96/68; 96/30; 96/33; 96/35.1; 96/75; 96/86 P; 96/87 R; 96/115 P; 96/115 R

[51] Int. Cl.².... G03F 7/08; G03F 7/10; G03C 1/54

[58] Field of Search.......... 96/33, 35.1, 75, 91 R, 96/115 R, 115 P, 68, 30, 87 R, 86 P

[56] References Cited

UNITED STATES PATENTS

| | | | |
|---|---|---|---|
| 3,136,637 | 6/1964 | Larson | 96/75 |
| 3,203,805 | 8/1965 | Burg | 96/115 P |
| 3,211,553 | 10/1965 | Ito | 96/33 |
| 3,376,139 | 4/1968 | Giangualano et al. | 96/115 R |
| 3,395,014 | 7/1968 | Cohen et al. | 96/115 P |
| 3,462,267 | 8/1969 | Giangualano et al. | 96/33 |
| 3,475,176 | 10/1969 | Rauner | 96/33 |
| 3,526,504 | 9/1970 | Celeste | 96/91 R |
| 3,558,309 | 1/1971 | Laridon et al. | 96/35.1 |
| 3,586,507 | 6/1971 | Burnett | 96/75 |
| 3,615,435 | 10/1971 | Chu et al. | 96/115 P |
| 3,617,288 | 11/1971 | Hartman | 96/90 R |
| 3,640,718 | 2/1972 | Smith | 96/115 P |
| 3,647,447 | 3/1972 | Gilson et al | 96/35.1 |
| 3,652,272 | 3/1972 | Thomas | 96;96/75;33 |
| 3,655,625 | 4/1972 | Thomas | 96/115 R |
| 3,671,236 | 6/1972 | Von Beusekom | 96/75 X |
| 3,808,004 | 5/1969 | Van Beusekom | 96/75 |

FOREIGN PATENTS OR APPLICATIONS

| | | | |
|---|---|---|---|
| 1,141,544 | 1/1969 | United Kingdom | 96/75 |
| 1,274,017 | 5/1972 | United Kingdom | 96/75 |

OTHER PUBLICATIONS

Abstracts of Photo Sci. and Eng., Oct. 1972, Abstract No. 8721–8772 P, (British Pat. No. 1,274,017 equivalent to Belgian Pat. No. 733,491).

*Primary Examiner*—Charles L. Bowers, Jr.
*Attorney, Agent, or Firm*—Alexander, Sell, Steldt & DeLaHunt

[57] ABSTRACT

Light-sensitive sheet material is provided comprising a base sheet bearing a thin coating of a diazo resin over which is provided a photopolymerizable layer. Upon exposure of the sheet material to actinic radiation, the image areas of the photopolymerizable layer as well as corresponding areas of diazo resin are insolubilized. Preferred sheet material is useful in lithographic printing.

9 Claims, 4 Drawing Figures

INVENTOR
JAMES A. BONHAM
BY
Kinney, Alexander,
Sell, Steldt & DeLaHunt
ATTORNEYS

PHOTOPOLYMERIZABLE SHEET MATERIAL WITH DIAZO RESIN LAYER

This is a continuation of application Ser. No. 209,137 filed Dec. 17, 1971, now abandoned.

FIELD OF THE INVENTION

This invention relates to light-sensitive sheet material and to graphic printing and duplication and, more particularly, to a photopolymerizable sheet capable of use, inter alia, as a lithographic printing plate.

BACKGROUND OF THE INVENTION

A presensitized lithographic plate having an organophilic polymeric surface overlaying a light-sensitive diazo layer supported by a dimensionally stable, hydrophilic surfaced base is described in Larson, U.S. Pat. No. 3,136,637. The overlayer exists in a polymeric state both beofre and after exposure of the plate, and the actinic light received during exposure of the plate acts solely on the underlying light-sensitive diazo resin to cause insolubilization thereof in light-exposed areas. This plate is developable as a result of the differential softenability or solubility between exposed and unexposed areas of the diazo resin layer. The developing medium is chosen such that it will soften and permeate the organophilic resin layer non-selectively to reach the diazo resin layer where it will dissolve unexposed regions thereby allowing such unexposed regions of the diazo layer and overlying organophilic resin to be removed, generally in conjunction with a gentle swabbing action. There is some tendency during the development step, however, for the organophilic resin overlayer, which is in an over-all softened condition owing to its uniform nature and non-selective softenability and permeability to developer, to be undesirably removed in exposed image areas as well as in unexposed areas. This is especially the case where exposed image areas border the unexposed areas. It has long been a desire, therefore, to employ an organophilic surface overlayer which undergoes a change upon light exposure so that the organophilic layer itself is differentially developable rather than relying upon an underlying composition to perform that role.

As an improvement on the Larson lithographic plate, numerous patents describe lithographic plates or the like employing a photosensitive organophilic layer. For example, see U.S. Pat. No. 3,462,267, British Pat. No. 1,141,544, and Belgian Pat. No. 733,491, wherein the organophilic layer is a photocrosslinkable polymer or prepolymer composition which is insolubilized by the cross-linking action of pendant photolabile groups. However, the organophilic layer of such lithographic plates is not developable in the same solutions as used for the diazo resin. Consequently, two or more developing steps must be used for such plates. Furthermore, the difference in solvent softenability between exposed and unexposed organophilic layer is not sufficiently dramatic when in contact with developer to insure the attainment of sharp, clear image borders during development even when gently swabbed.

Other patents describe printing plates or lithographic plates utilizing simply a free radical photopolymerizable organophilic layer which directly overlies the base sheet. For example, see U.S. Pat. Nos. 2,760,863; 3,468,311; 3,475,171; 3,512,971, 3,516,828; and 3,549,367. However, such photopolymerizable layers provide characteristically poor adhesion to permanently hydrophilic, passivated substrates, such as silicated aluminum, upon polymerization. Furthermore, development of such exposed layers must be controlled so as to avoid overdevelopment or undercutting of the image areas.

SUMMARY OF THE INVENTION

In one aspect, the present invention provides a light-sensitive sheet comprising a base-sheet having a hydrophilic surface which bears a coating of a thin, soluble, light-sensitive diazo resin over which is coated a non-tacky, soluble, photopolymerizable layer. The photopolymerizable layer comprises a film forming polymeric binder having dispersed therethrough (a) at least one normally non-volatile, ethylenically unsaturated monomeric compound capable of forming a high polymer by free-radical initiated, chain propagating, addition polymerization, the compound having at least two sites of ethylenic unsaturation, and (b) a photoinitiator system which is normally non-reactive in the photopolymerizable layer but which, upon absorption of actinic radiation, is capable of generating free radicals.

In another aspect, the invention provides a light-sensitive sheet comprising a base sheet bearing a thin layer of a soluble, light-sensitive diazo resin over which is coated a non-tacky soluble, photopolymerizable layer comprising a film-forming polymeric binder having dispersed therethrough (a) at least one normally non-volatile ethylenically unsaturated monomeric compound capable of forming a high polymer by free-radical initiated, chain propagating, addition polymerization, the compound having at least two sites of ethylenic unsaturation, and (b) a photoinitiator system comprising an organic halogen compound which is normally non-reactive in said layer but which, upon absorption of actinic radiation, is capable of generating free radicals.

Because the photopolymerizable layer of the novel light-sensitive sheet material undergoes a dramatic physical change upon exposure of the sheet material to actinic radiation, the exposed sheet material can be developed with solvent very conveniently and efficiently. The exposed areas of the photopolymerizable layer are tough, water-insoluble and solvent resistant whereas the unexposed areas are quite solvent soluble. The photopolymerizable composition is designed such that, for a given exposure, its rate of polymerization and insolubilization is at least as great as the rate of insolubilization of the diazo resin layer so that most effective bonding of the photopolymerizable layer to the base sheet by means of the diazo resin is obtained. Consequently, upon solvent development of the exposed sheet material, very sharp and clearly defined borders of the image areas result.

The novel light-sensitive sheet material is also quite resistant to high humidity environments and, accordingly, it exhibits good storage stability.

DETAILED DESCRIPTION OF THE INVENTION

The light-sensitive sheets of the invention are illustrated by the accompanying drawings, wherein like reference characters refer to the same parts throughout the several views, and in which.

Figure 1:
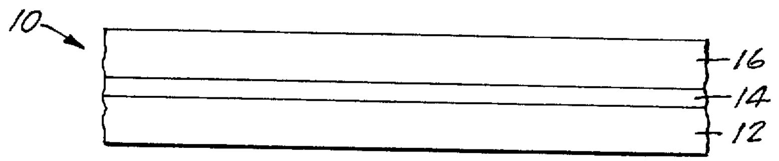
FIGS. 1 and 2 are cross-sectional views of the light-sensitive sheet, the latter view showing a releasable or removable liner covering the sheet.

Referring first to FIG. 1 there is shown a light-sensitive sheet 10 comprising a base sheet 12 bearing a thin layer 14 of a stable, initially soluble, light-sensitive diazo resin. Overlying layer 14, and in direct contact therewith, is a photopolymerizable layer 16. Layer 16 comprises a film-forming binder having dispersed therethrough at least one monomer capable of undergoing addition polymerization and a photoinitiator system which generates free radicals when exposed to actinic radiation.

In terms of physical properties, photopolymerizable layer 16 is non-tacky, solvent soluble, resilient and pliable but yet is scuff-resistant (i.e., it is not scratched or scraped under normal handling conditions). Preferably, layer 16 is soluble in a solvent or solvent blend in which unexposed diazo resin is soluble, thereby affording ease and convenience of development of the sheet material.

Figure 2:
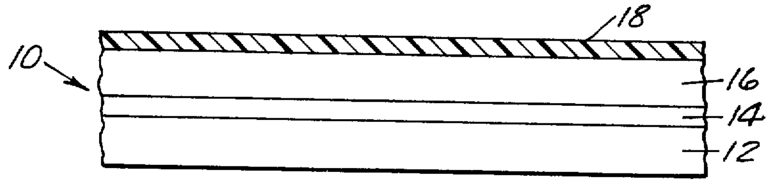

FIG. 2 shows sheet material 10 wherein a protective liner or soluble film 18 is releasably bonded to photopolymerizable layer 16. Liner 18 may be a plastic film, siliconized paper, polyvinyl alcohol film, polyvinylpyrollidone film, etc.

Figure 3:
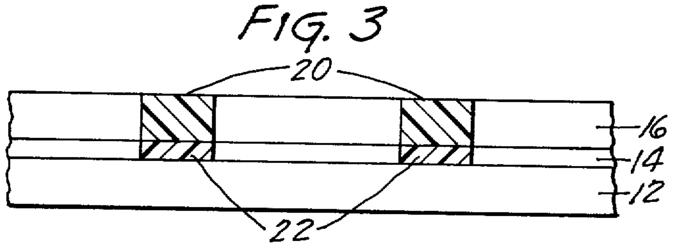
FIG. 3 is a cross-sectional view of the light-sensitive sheet after image-wise exposure thereof to actinic radiation.

In FIG. 3 there is shown the sheet material of FIG. 1 after it has been exposed image-wise to actinic light, e.g., through a transparency or stencil. Areas 20 represent exposed image areas of photopolymerizable layer 16, and areas 22 represent the corresponding exposed areas of diazo layer 14.

In areas 20 the actinic light has stimulated the photo-initiator contained in layer 16, the photo-initiator generating free radicals which cause the monomers contained within the image areas of the photopolymerizable layer to polymerize, thereby forming image areas which are oleophilic, hydrophobic, water-insoluble, solvent-resistant, tough, resilient, and abrasion resistant. In unexposed areas the photopolymerizable layer remains solvent soluble.

In areas 22 the actinic light renders the diazo resin solvent-insoluble and causes the diazo resin to adhere firmly to base sheet 12 and also to areas 20. In unexposed areas the diazo resin remains unreacted and water or solvent soluble.

Figure 4:
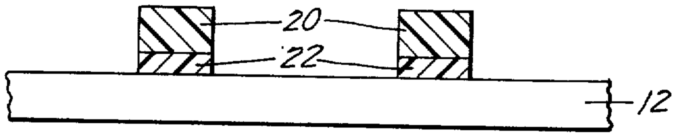
FIG. 4 is a cross-sectional view of the sheet of FIG. 3 after solvent development.

In FIG. 4 there is shown the exposed sheet material of FIG. 3 after solvent development. Image areas 20 are firmly bonded to base sheet 12 by means of areas 22 of exposed diazo resin. The development step typically involves wiping or gently scrubbing the exposed plate with one or more processing solvents. Preferably the unexposed portions of the photopolymerizable layer and unexposed portions of the diazo resin layer are soluble in the same solvent, or solvent blend, for most convenient and efficient development.

When the light-sensitive sheet material of the invention is to be used as a lithographic printing plate, the base sheet has, as at least one major surface thereof, a permanently hydrophilic, passivated surface. A suitable diazo resin is then coated onto the treated base sheet in the form of a thin, continuous layer, the diazo resin amounting to about 1 to 20 mg./ft.$^2$.

Suitable base sheets for lithographic plates include metals (e.g. aluminum, copper, zinc), glass, paper, etc. Prior to application of the diazo resin to the surface of such substrates for lithographic purposes, it is generally necessary to passivate the surface to prevent any deleterious interaction between the surface Suitable and the diazo resin. Such passivating treatments may also promote a firm bond between the exposed portions of the diazo resin and the substrate and may also aid in providing a hydrophilic surface during the lithographic printing process. The silicate treatment described in Jewett and Case, U.S. Pat. No. 2,714,066 is the preferred passivating treatment for metal substrates. Other passivating treatments are disclosed in U.S. Pat. No. 2,946,638 (zirconium hexahalide), U.S. Pat. No. 3,201,247 (phosphomolybdate treatment), and U.S. Pat. No. 3,148,984. Suitablel coating techniques used to accomplish the same purpose are described in U.S. Pat. No. 3,161,517 and U.S. Pat. No. 3,196,785.

The preparation of suitable diazo resins is described in U.S. Pat. No. 2,714,066. Exemplary suitable salts of the condensation product of paraformaldehyde and p-diazodiphenylamine include the salts of phenol, fluorocaprylic acid, and the following sulfonic acids: triisopropyl naphthalene sulfonic acid, 4,4-biphenyldisulfonic acid, 5-nitro ortho-toluene sulfonic acid, 5-sulfosalicylic acid 2,5-dimethyl benzene sulfonic acid, 2-nitrobenzene sulfonic acid, 1,3,6-naphthalenetrisulfonic acid, 3-chlorobenzene sulfonic acid, 3-bromobenzene sulfonic acid, 1-butane sulfonic acid, 2-chloro-5-nitrobenzene sulfonic acid, 2,4-dinitrobenzene sulfonic acid, 2-fluorocaprylic naphthalene sulfonic acid, fluorocaprylic sulfonic acid, 4-nitrobenzene sulfonic acid, 2,5-dichlorobenzene sulfonic acid, 2,4-dimethylbenzene sulfonic acid, 1-naphthol-5-sulfonic acid, and paratoluene sulfonic acid. A preferred diazo salt is that derived from the condensation product of paraformaldehyde and p-diazodiphenylamine and trisopropyl naphthalene sulfonic acid.

The photopolymerizable layers used in the novel light-sensitive sheet comprise a film-forming binder having dispersed therethrough monomer capable of undergoing addition polymerization and a photoinitiator. The monomer component of the layer comprises at least one normally non-volatile monomeric compound which is capable of forming a high polymer by free radical initiated, chain propagating, addition polymerization, the monomeric compound having at least two sites of ethylenic unsaturation. Additional monomeric compounds may be included in the photopolymerizable layer, and preferably such additional monomeric compounds also have at least two sites of ethylenic unsaturation.

Representative monomeric compounds are described in U.S. Pat. No. 3,203,805. The preferred monomeric compounds are selected from the group consisting of normally non-volatile acrylates and methacrylates. Representative of such monomeric compounds are:

Trimethylol propane trimethacrylate
Triethylene glycol dimethacrylate
Tetraethylene glycol dimethacrylate
Glyceryl trimethacrylate
Trimethylolpropane allyl ether dimethacrylate
1,3-Butane diol diacrylate
Diethylene glycol diacrylate
Pentaerythritol tetraacrylate
Tetraethylene glycol diacrylate
Triethylene glycol diacrylate Trimethylolpropane triacrylate
Pentaerythritol tetramethacrylate
Propoxylated bisphenol A dimethacrylate
Trimethacrylate of (Tris 2-hydroxyethyl) isocyanurate Photoinitiator systems which are suitable for use in the practice of this invention include those materials which are normally non-reactive in the photopolymerizable layer but which, upon absorption of actinic radiation, are capable of generating free radicals. For example, the vicinal polyketaldonyl compounds described in U.S. Pat. No. 2,367,660, the alpha-carbonyls described in U.S. Pat. No. 2,367,661 and U.S. Pat. No. 2,367,670, the acyloin ethers described in U.S. Pat. No. 2,448,828, the alpha-hydrocarbon substituted aromatic acyloins described in U.S. Pat. No. 2,722,512, the polynuclear quinones described in U.S. Pat. No. 3,046,127 and U.S. Pat. No. 2,951,758, and the triarylimidazolyl dimer/p-aminophenyl ketone combination described in U.S. Pat. No. 3,549,367 are useful photoinitiators. Other suitable photoinitiator systems include the dye-sensitized photolyzable organic halogen compounds described in copending application Ser. No. 720,377, now U.S. Pat. No. 3,640,718, and in U.S. Pat. No. 3,617,288.

These organic halogen-containing photoinitiator compounds are substantially neutral, i.e. neither acidic nor basic, and in the absence of actinic radiation are chemically inert toward the monomers contained in the photopolymerizable layer. In addition they are of sufficiently low vapor pressure to remain in the photopolymerizable layer prior to photolysis, and are sufficiently stable to avoid undergoing decomposition under all normal storage conditions. On exposure to actinic radiation such as ultraviolet radiation, or visible light when employed in conjunction with suitable sensitizing dyes, these compounds undergo dissociation at one or more of the carbon-halogen bonds. The bond dissociation energy for the carbon-halogen bond should be between about 40 and about 70 kilogram-calories per mole.

The preferred photoinitiator systems comprise the vinyl-substituted halomethyl-s-triazines described in copending application Ser. No. 177,851, filed Sept. 3, 1971, incorporated herein by reference. These photoinitiators are preferred because they induce higher polymerization rates for the photopolymer than do other photoinitiators, low concentrations of these photoinitiators can be used because of their effectiveness, they are less oxygen inhibited than other photoinitiators, and they do not require the presence of sensitizing dyes.

A wide variety of polymeric, thermoplastic film-forming binders may be used as part of the photopolymerizable layer. Since the film-forming binder influences the physical properties of the photopolymerizable layer, the preferred binders are non-tacky or non-adhesive in nature. The tackiness of the photopolymerizable layer can be minimized by selecting binders which are not easily plasticized by the particular monomers present in such layer.

Suitable binder resins include those described in U.S. Pat. No. 3,203,805, e.g. copolyesters, nylons, vinylidene chloride copolymers, ethylene/vinyl acetate copolymers, cellulose ethers, polyethylene, synthetic rubbers, cellulose esters, polyvinyl esters, polyacrylate and alpha-alkyl polyacrylate esters, polyvinyl chloride, polycinvyl acetal, polyformaldehydes, polyurethanes, polycarbonates, and polystyrenes. The preferred binders are non-tacky and include mixtures of polyvinyl acetal, polyvinyl chloride-vinyl acetate, and polyacrylate esters.

The amount and type of the monomeric compound and film-forming binder present in the photopolymerizable layer are chosen such that the photopolymerizable layer is non-tacky, solvent soluble, resilient, pliable, and scuff-resistant (i.e. not easily scraped or scratched during normal handling). Functionally speaking, the amount of monomer present should be sufficient to undergo polymerization at a rate and to an amount such that the resulting polymerized areas are water-insoluble, tough, solvent-resistant, resilient, flexible, scratch-resistant and abrasion-resistant.

It is also necessary that the cure rate (i.e. rate of polymerization to an insoluble state) of the photopolymerizable layer be at least as great as, and preferably several times greater than, the rate of diazo resin decomposition or insolubilization upon exposure to actinic radiation. When the foregoing condition is met the diazo resin, in image areas, chemically bonds to the photopolymerizable layer, in image areas, and to the base sheet. The more important advantage achieved in this manner, however, is that the high gamma characteristic of the diazo resin layer serves to enhance the attainment of sharp, clearly defined images upon development of the exposed sheet material. Consequently, firm bonding of the photopolymerizable layer to the base sheet is achieved while at the same time minimizing problems of halation, image broadening and image shrinking, yet the advantages of a tough, abrasion-resistant, oleophilic and solvent-resistant top coating are also obtained.

The film-forming binder and the monomeric compound should also be sufficiently compatible that a homogeneous layer is obtained which does not stratify during storage. Typically the monomeric compounds are present in an amount ranging from about 20 to about 80 percent by weight based on the total weight of the photopolymerizable layer, and the film-forming binder generally represents about 20 to about 80 percent by weight of the photopolymerizable layer. Preferably, the monomer represents about 30 to about 50 percent of the total weight of the photopolymerizable layer. The photoinitiator is present in an amount sufficient to cause the monomeric compounds to undergo polymerization at a rate which is at least as great as the rate of diazo resin decomposition. The amount of photoinitiator used is generally in the range of about 0.05 to about 10 percent by weight based on the total weight of the monomeric compounds present, preferred amounts of photoinitiators present being 1–2 percent.

Minor amounts (i.e. 10 to 500 parts per million based on monomer) of polymerization inhibitors, e.g. hydroquinone, phenothiazine and p-methoxyphenol, are typically present in the photopolymerizable layer along with the monomers. Such inhibitors prevent spontaneous, thermally induced polymerization but their effects are overcome by the photoinitiator upon exposure of the layer to actinic radiation.

Conventional exposure indicators (i.e. direct print-out image indicators) may also be present in the photopolymerizable layer. Direct print-outs based on photochromics, leuco dyes, and pH indicators and dye bases are all well-known and are all useful.

Pigments may be included in the photopolymerizable layer in minor amounts for the purpose of imparting color to the layer for visual inspection of the image during development, so long as the pigments do not inhibit the polymerization of the monomeric compounds, bleed excessively during development of the light-sensitive sheet, or completely filter out the actinic radiation required to insolubilize the diazo resin. Thus, the preferred pigments are insoluble, e.g. phthalocyanine blue and alkali red.

The developer systems which are most suitable for developing the exposed sheet material are those which dissolve both unexposed diazo resin and unexposed photopolymerizable layer. Such developers are aqueous systems which contain minor amounts of water-miscible solvents, e.g. lower alcohols such as methanol, ethanol, isopropanol and n-propanol. Other organic solvents which may also be present include dimethyl formamide, acetonitrile, acetone, 2-butanone, ethyl acetate, butyl acetate, etc., or mixtures of these. The developer system may also include agents which aid in removal of unexposed diazo resin. Such agents include, e.g., phosphate salts (e.g. ammonium, potassium, or sodium salts), permanganate salts (e.g. ammonium, potassium, or sodium salts), sulfites (e.g. ammonium, potassium, or sodium), weak bases such as sodium and potassium acetate and carbonate.

The invention is further illustrated by means of the following non-limiting examples wherein the term "parts" refers to parts by weight unless otherwise indicated.

EXAMPLE 1

A lithographic printing plate is prepared using an aluminum sheet which has been conventionally brush grained on one surface. The aluminum sheet is then degreased, etched, silicate treated, and diazo-sensitized in accordance with the teachings of U.S. Pat. No. 2,714,066 (example).

A photopolymerizable coating composition is prepared by ball milling the following ingredients together until homogeneous:

| | Parts by Weight |
|---|---|
| "Formvar 15/95S" (a polyvinyl formal resin commercially available from Monsanto | 38.0 |
| "Vinylite VMCH" (a vinyl acetate/vinyl chloride/maleic anhydride copolymer commercially available from Union Carbide) | 12.5 |
| "Cyan Blue XR55-3758" (a phthalocyanine pigment commercially available from American Cyanamid) | 9.0 |
| Trimethylol propane trimethacrylate | 28.5 |
| Trimethacrylate of trishydroxyethyl isocyanurate | 9.5 |
| 2-(p-methoxystyryl)-4,6-bis(trichloromethyl)-s-triazine | 1.5 |
| 2-(p-dimethylaminostyryl)quinoline | 1.0 |
| ethylene dichloride solvent | 614 |

Additional ethylene dichloride solvent is added to the composition to adjust the solids content and viscosity depending upon the coating technique (e.g. pour-on, web-fed flow coater, dip coater, etc.) to be used in preparing the lithographic plate. For pour-on coatings a 3–4 percent solids content provides average coating weights of about 0.2 gram/ft.$^2$.

A continuous blue-green film of the photopolymerizable layer results after coating, under subdued light, the above composition onto the diazo sensitized aluminum sheet and drying at 140° F. for 3 minutes. Coating weights ranging from about 0.1 gram/ft.$^2$, to about 1.5 gram/ft.$^2$ can be employed, with about 0.2 gram/ft.$^2$ being preferred.

The resulting lithographic printing plate can be stored for periods exceeding 1 year without loss of light-sensitivity.

As a typical exposure example, the lithographic printing plate of Example 1 is exposed through a conventional half-tone negative and a 21 step $\sqrt{2}$ "Lithographic Technical Foundation" Exposure Wedge in a vacuum frame using a reflectorized 135 amp., High Intensity Photo 118 Carbon Arc Rod source (available from Union Carbide) at a distance of 54 inches. A red image of the original is obtained on a blue-green background.

The imaged plate is then developed by first immersing it in a solution containing 37 percent n-propyl alcohol, 60 percent distilled water, 1.5 percent ammonium sulfite, and 1.5 percent ammonium dihydrogen phosphate. The non-exposed areas of the plate are removed using a 3M Brand Developing Pad with light scrubbing action to give a developed plate having blue photopolymer image areas on an off-white aluminum background. Reproduction characteristics are described as a solid step 7, i.e. sufficient insolubilization is achieved through the first seven steps of the exposure wedge, with the 3 percent half-tone dots not being faded while the 97 percent screens are completely open.

The developed plate is gummed using the 3M Brand Subtractive Gum in order to protect the hydrophilic background from contamination during handling and storage prior to the printing operation.

The plate exhibits excellent ink/water balance characteristics and produces good copies when run on a conventional offset press.

EXAMPLE 2

A lithographic printing plate is prepared using a grained aluminum sheet which has been treated and sensitized in the manner described in Example 1. The sheet is coated with a photopolymerizable composition containing the following ingredients:

| | Parts |
|---|---|
| "Formvar 15/95S" | 41.28 |
| "Epon 1004" (a bisphenol A/epichlorohydrin derived epoxy resin commercially available from Shell) | 13.74 |
| "Alkali Red RT-539 D" (a pigment commercially available from DuPont) | 5.92 |
| "Cyan Blue XR55-3758" (a pigment commercially available from American Cyanamid) | 3.26 |
| Trimethylol propane trimethacrylate | 55.00 |
| 2-Ethyl-9,10-dimethoxyanthracene | 1.86 |
| 2,4,6-tris(tribromomethyl)-s-triazine | 1.86 |
| 1,2-Dichloroethane | 3043 |

The above composition was coated onto the diazo-sensitized plate under subdued light and dried at 180° F. for 2 minutes to give a coating weight of approximately 0.2 gram/ft.$^2$. The resulting printing plate performed similar to the printing plate of Example 1.

Representative of other monomers which may be used in the above composition in place of the trimethylol propane trimethacrylate include trimethylol propane triacrylate, pentaerythritol tetracrylate, trimethacrylate of tris(hydroxyethyl) isocyanurate, bis(hydroxyethyl) phthalate dimethacrylate, bis(hydroxyethyl) bisphenol A dimethacrylate, bis(hydroxyethyl) diphenyl sulfone dimethacrylate, and diethylene glycol dimethacrylate.

EXAMPLE 3

A lithographic printing plate is prepared using an aluminum sheet which has been treated and diazo sensitized in accordance with Example 1. The sensitized plate is then coated with a composition containing the following ingredients (20percent solids in toluene):

| | Parts |
|---|---|
| poly(methyl methacrylate/methacrylic acid) (99/1 mole ratio) binder | 0.3 |
| trimethylol propane trimethacrylate | 0.2 |
| 2,4,6-tris(tribromomethyl)-s-triazine | 0.01 |
| 2-ethyl-9,10-dimethoxyanthracene | 0.01 |

The above composition was coated onto the sensitized plate under subdued light and dried to leave a coating weight of approximately 0.2 gram/ft.$^2$.

The resulting lithographic plate is exposed, developed, and processed in the manner described in Example 1. It exhibits good ink/water balance characteristics and produces good copies when run on an offset press. The plate also exhibits good shelf storage stability, is easily developed, and is resistant to humidity.

Other representative binder systems which may be used in the above composition include poly(methyl methacrylate/methacrylic acid) (90/10 mole ratio); poly(methyl methacrylate), which is commercially available from DuPont as "Elvacite 2041," using methyl ethyl ketone as the solvent system; and cellulose acetate hydrogen phthalate, using acetone as the solvent system.

EXAMPLE 4

A lithographic plate prepared in accordance with Example 3 is overcoated with the following composition, and then dried, to leave a thin top coating (approximately 0.1 gram/ft.$^2$ dry) covering the photopolymerizable layer.

| Composition Ingredients | Parts |
|---|---|
| polyvinyl alcohol ("Elvanol 50-42" commercially available from DuPont) | 2 |
| polyvinyl pyrrolidone (Grade K-90) | 1 |
| water/methanol blend (2/1 weight ratio) | 125 |

The so-coated plate is exposed, developed and processed in the manner described in Example 1. Because the thin top-coating is effective as an oxygen barrier, however, the plate of this example need only be exposed for one-half the time normally required for the lithographic plate of Example 3. That is, the oxygen barrier reduces the inhibitor effect of oxygen on the free radical polymerization in the photopolymerizable layer.

Other types of oxygen barriers are well known to the art and also can be used in combination with all of the light-sensitive sheet materials of this invention to increase the rate of polymerization in the photopolymerizable layer, although the preferred light-sensitive sheet materials of this invention do not require the presence of an oxygen barrier coating.

EXAMPLES 5–8

Lithographic printing plates are prepared using the treated and diazo sensitized aluminum sheets described in Example 1 and the coating compositions in Table I below. The low percent solids coating compositions are prepared using 1,2-dichloroethane as the solvent medium, and the compositions are coated onto the aluminum sheets to provide a dry coating weight of approximately 0.2 gram/ft.$^2$.

The resulting lithographic plates are exposed, developed and processed in the manner described in Example 1.

TABLE I

| Ingredients | Coating Composition (Parts by Weight) 5 | 6 | 7 | 8 |
|---|---|---|---|---|
| "Formvar 15/95S" | 44.5 | 38.2 | 7.38 | 7.38 |
| "Vinylite VMCH" | 14.8 | 12.7 | 2.46 | 2.46 |
| Trismethacrylate of trishydroxyethyl isocyanurate | 29.5 | 9.2 | 2.0 | 2.0 |
| Trimethylol propane trimethacrylate | — | 27.6 | 6.0 | 6.0 |
| 2-Ethyl-9,10-dimethoxyanthracene | 2.0 | 2.0 | 0.35 | 0.35 |
| 2,4,6-tris(tribromomethyl)-s-triazine | 2.0 | — | 0.35 | — |
| 2,4-bis(trichloromethyl)-6-methyl-s-triazine | — | 2.0 | — | 0.35 |
| 2-(p-dimethylaminostyryl)-quinoline | — | 2.0 | 0.20 | — |
| Leuco dye | — | — | — | 0.20 |
| "Alkali Red RT-539 D" | — | — | — | 1.22 |
| "Cyan Blue XR55-3758" | 7.4 | 6.4 | 1.22 | — |

1. 2-chloro-N',N''-bis-β-hydroxyethyl-N,N,N',N''-tetramethyl-4,4',4''-triaminotriphenylmethane The light-sensitive sheet material of the invention is also useful in conventional techniques of proofing color separation negatives preparatory to color lithography. For example, one such color proofing technique is described in U.S. Pat. No. 3,136,637. For such purposes it is desirable to use a base sheet which is dimensionally stable, colorless, and transparent. A preferred base sheet is a thin polyethylene terephthalate film which is biaxially oriented. Thus, by utilizing the pigments described in U.S. Pat. No. 3,136,637 in the photopolymerizable compositions described herein one can make light-sensitive sheet material which has general applicability to color proofing techniques.

I claim:

1. A light-sensitive sheet useful as a presensitized lithographic plate comprising:

a. a base sheet having at least one permanently hydrophilic, passivated surface;
b. a thin, continuous light-sensitive diazo resin layer overlying said hydrophilic surface; said diazo resin layer being about 1 to 20 mg/ft$^2$ and being a condensation product of an aldehyde and a diazonium compound, said diazo resin being soluble in aqueous-based developing solutions;
c. a continuous non-tacky, photopolymerizable layer over said diazo resin layer and in direct contact therewith, said photopolymerizable layer being about 0.1 to 1.5 gram/ft$^2$, said photopolymerizable layer having a cure rate at least as great as the rate of insolubilization of said diazo resin upon exposure to actinic radiation and said photopolymerizable layer comprising a film-forming polymeric binder having dispersed therethrough:
   i. at least one normally non-volatile acrylate or methacrylate monomeric compound capable of forming a high polymer by free-radical initiated, chain propagating, addition polymerization, said compound having at least two sites of ethylenic unsaturation, and
   ii. a photoinitiator which comprises a photolyzable s-triazine having at least one trihalomethyl group and at least one chromophoric moiety conjugated with the triazine ring by ethylenic unsaturation, said photoinitiator being normally non-reactive in said layer but which, upon absorption of actinic radiation, is capable of generating free radicals;

wherein said binder represents about 20 to 80 weight percent of said photopolymerizable layer, said monomeric compound represents about 20 to 80 percent of said photopolymerizable layer, and said photoinitiator is present in an amount of about 0.05 to 10 percent based on the total weight of said monomeric compound; wherein upon image-wise exposure of said light-sensitive sheet to actinic radiation said diazo resin, in exposed areas, becomes insolubilized and said photopolymerizable layer, in exposed areas, becomes an ink-receptive layer which is oleophilic, hydrophobic, water-insoluble, solvent-resistant and tough; and wherein said diazo resin, in exposed areas, is firmly bonded to said hydrophilic surface and to said ink-receptive layer; and wherein the unexposed areas of said diazo resin and said photopolymerizable layer are readily removable from said hydrophilic surface and from adjacent areas of exposed diazo resin and exposed photopolymerizable layer with aqueous-based developing solution.

2. A light-sensitive sheet in accordance with claim 1, wherein said photopolymerizable layer comprises two ethylenically unsaturated monomeric compounds, at least one of said compounds being selected from the group consisting of normally non-volatile acrylates and methacrylates.

3. A light-sensitive sheet in accordance with claim 2, wherein both of said compounds are selected from the group consisting of normally non-volatile acrylates and methacrylates.

4. A light-sensitive sheet in accordance with claim 1, wherein said photolyzable s-triazine is 2(p-methoxystyryl)-4,6-bis(trichloromethyl)-s-triazine.

5. A light-sensitive sheet in accordance with claim 1, wherein said hydrophilic surface comprises a silicate surface.

6. A light-sensitive sheet useful in color proofing comprising:
a. a dimensionally stable, colorless, transparent base sheet;
b. a thin, continuous light-sensitive diazo resin layer overlying said base sheet; said diazo resin layer being about 1 to 20 mg/ft$^2$ and being a condensation product of an aldehyde and a diazonium compound, said diazo resin being soluble in aqueous-based developing solutions;
c. a continuous, non-tacky, photopolymerizable layer over said diazo resin layer and in direct contact therewith, said photopolymerizable layer being about 0.1 to 0.5 gram/ft$^2$, said photopolymerizable layer having a cure rate at least as great as the rate of insolubilization of said diazo resin upon exposure to actinic radiation and said photopolymerizable layer comprising a film-forming polymeric binder having dispersed therethrough:
   i. at least one normally non-volatile acrylate or methacrylate monomeric compound capable of forming a high polymer by free-radical initiated, chain propagating, addition polymerization, said compound having at least two sites of ethylenic unsaturation, and
   ii. a photoinitiator which comprises a photolyzable s-triazine having at least one trihalomethyl group and at least one chromophoric moiety conjugated with the triazine ring by ethylenic unsaturation, said photoinitiator being normally non-reactive in said layer but which, upon absorption of actinic radiation, is capable of generating free radicals;

wherein said binder represents about 20 to 80 weight percent of said photopolymerizable layer, said monomeric compound represents about 20 to 80 percent of said photopolymerizable layer, and said photoinitiator is present in an amount of about 0.05 to 10 percent based on the total weight of said monomeric compound; wherein upon image-wise exposure of said light-sensitive sheet to actinic radiation said diazo resin, in exposed areas, becomes insolubilized and said photopolymerizable layer, in exposed areas, becomes an ink-receptive layer which is oleophilic, hydrophobic, water-insoluble, solvent-resistant and tough; and wherein said diazo resin, in exposed areas, is firmly bonded to said base sheet and to said ink-receptive layer; and wherein the unexposed areas of said diazo resin and said photopolymerizable layer are readily removable from said base sheet and from adjacent areas of exposed diazo resin and exposed photopolymerizable layer with aqueous-based developing solution.

7. A light-sensitive sheet in accordance with claim 6, wherein said photopolymerizable layer comprises two ethylenically unsaturated monomeric compounds, at least one of said compounds being selected from the group consisting of normally non-volatile acrylates and methacrylates.

8. A light-sensitive sheet in accordance with claim 6, wherein said base sheet comprises a dimensionally stable, colorless, transparent film.

9. A light-sensitive sheet in accordance with claim 8, wherein said base sheet comprises a thin polyethylene terephthalate film.

* * * * *